(12) United States Patent
Hellberg

(10) Patent No.: US 6,337,885 B1
(45) Date of Patent: *Jan. 8, 2002

(54) RADIO RECEIVER THAT DIGITIZES A RECEIVED SIGNAL AT A PLURALITY OF DIGITIZATION FREQUENCIES

(75) Inventor: Lars Richard Birger Hellberg, Huddinge (SE)

(73) Assignee: Telefonaktiebolaget LM Ericsson (publ), Stockholm (SE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/023,873

(22) Filed: Feb. 13, 1998

(51) Int. Cl.[7] .......................... H03K 9/00; H04L 27/06; H04L 27/14; H04L 27/22
(52) U.S. Cl. ........................................ 375/316; 455/303
(58) Field of Search ........................ 375/267, 316–346, 375/347; 455/135, 132, 133, 137, 150.1, 303–315; 329/316, 302, 363

(56) References Cited

U.S. PATENT DOCUMENTS

| | | | | |
|---|---|---|---|---|
| 4,348,641 A | * | 9/1982 | Scott et al. | 329/302 |
| 5,099,194 A | * | 3/1992 | Sanderson et al. | 324/76.47 |
| 5,294,926 A | * | 3/1994 | Corcoran | 341/120 |
| 5,550,872 A | | 8/1996 | Liberti | |
| 5,564,097 A | * | 10/1996 | Swanke | 455/302 |
| 5,627,859 A | * | 5/1997 | Parr | 375/229 |
| 5,659,546 A | | 8/1997 | Elder | |
| 5,732,339 A | * | 3/1998 | Auvray et al. | 455/192.2 |
| 5,872,540 A | * | 2/1999 | Casabona et al. | 342/362 |
| 5,914,986 A | * | 6/1999 | Ohta et al. | 375/328 |
| 6,009,130 A | * | 12/1999 | Lurey et al. | 375/347 |
| 6,026,418 A | * | 2/2000 | Duncan, Jr. | 708/309 |
| 6,031,869 A | * | 2/2000 | Priebe et al. | 375/224 |
| 6,031,879 A | * | 2/2000 | Pace et al. | 375/316 |
| 6,038,248 A | * | 3/2000 | Rabaeijs et al. | 375/200 |

FOREIGN PATENT DOCUMENTS

EP 0650268 4/1995

OTHER PUBLICATIONS

Brad Brannon, "Overcoming Converter Nonlinearities With Dither", Analog Devices, pp. 1–8.

* cited by examiner

Primary Examiner—Stephen Chin
Assistant Examiner—Lenny Jiang
(74) Attorney, Agent, or Firm—Burns, Doane, Swecker & Mathis, L.L.P.

(57) ABSTRACT

A radio receiver converts an original frequency of a modulated received signal into a plurality of digitization frequencies and digitizes the modulated received signal at each one of the plurality of digitization frequencies. The receiver determines a plurality of reception quality measures associated with each one of the digitized modulated received signals at each one of the plurality of digitization frequencies. The receiver demodulates the modulated received signal using a digitized modulated signal at a digitization frequency that provides a better reception quality than those of another digitization frequency.

32 Claims, 5 Drawing Sheets

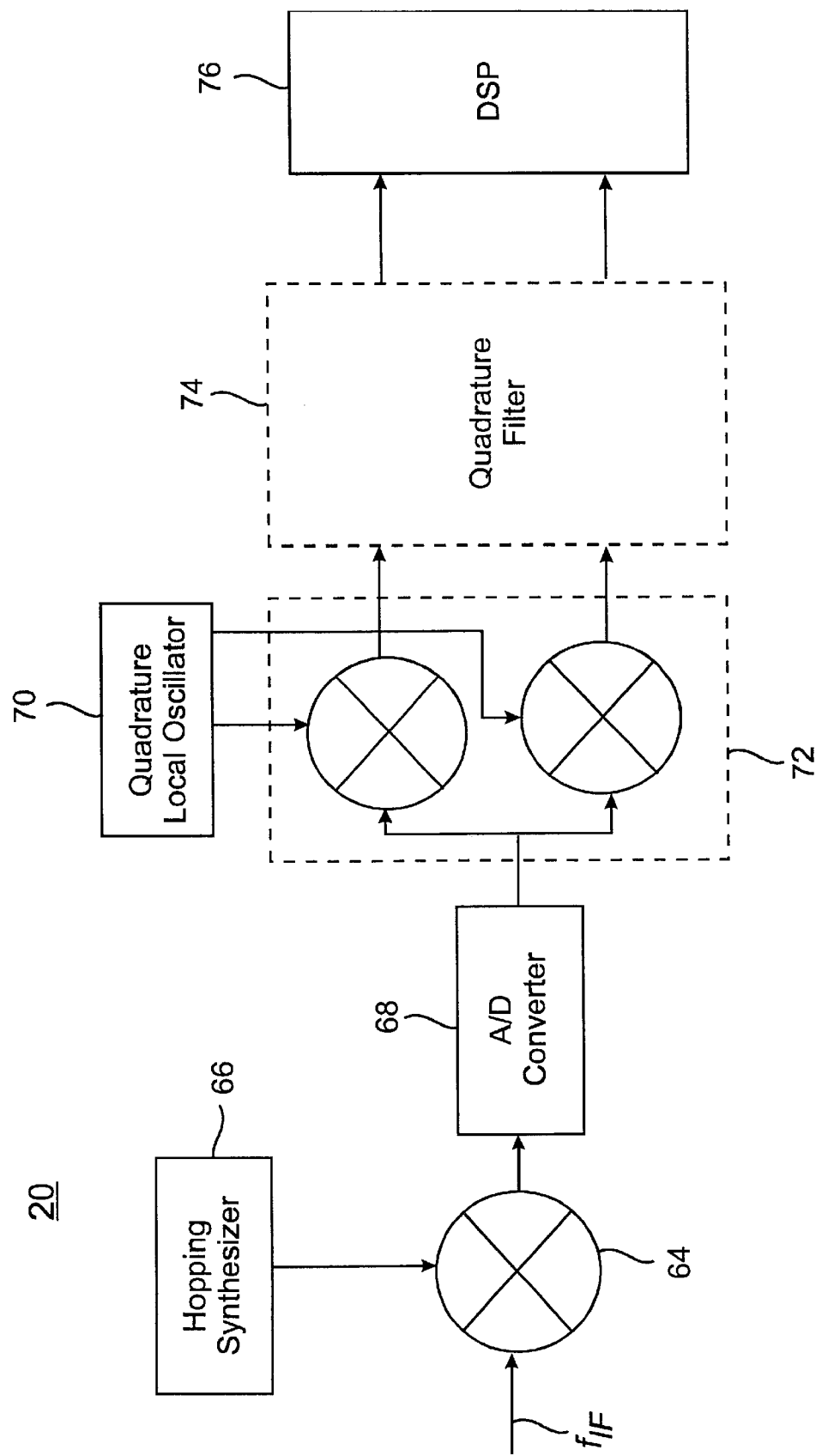

RADIO RECEIVER THAT DIGITIZES A RECEIVED SIGNAL AT A PLURALITY OF DIGITIZATION FREQUENCIES

TECHNICAL FIELD

This invention generally relates to the field of communications, more particularly, to radio receivers that digitally process a modulated received signal.

BACKGROUND

With rapid expansion of communication technology and services, demand for digital radio receivers and transmitters have grown exponentially. In radio receivers, Analog-to-Digital (A/D) converters are used to digitize analog radio frequency (RF) signals, which are modulated by a modulating signal. Once digitized, the modulated received signal can be demodulated using well known digital signal processing techniques.

An ideal converter has an error transfer function with a generally sawtooth shape. The error transfer function of such A/D converter has equal incremental steps that represent the differences between input signal levels and corresponding discrete quantized levels. When fabricated using available integrated circuit technologies, however, commercially available A/D converters exhibit inherent non-linearities, which are caused by their internal structure. As a result, the error transfer function of the commercial A/D converters include unequal discrete steps. Furthermore, the inherent non-linearities of a commercial A/D converter may superimpose a shape, for example, an S-shape, on the error transfer function of a commercial A/D converter.

When exposed to inherent non-linearities of the A/D converter, interfering signals produce spurious harmonics, which should be removed to improve receiver performance. For example, if an interfering signal generates spurious harmonics that fall on one or more desired channels, weak received signals on such channels may be masked by stronger spurious harmonics, thus, degrading reception quality on the channels.

The spurious harmonics generated due to non-linearities associated with the internal structure of the A/D converters can not be removed by filtering in the analog domain. In a conventional method, which hereafter is referred to as "harmonic avoidance", the harmonics of a large interfering signal are avoided by limiting the received signals to a small part of Nyquist band. However, this method requires sharper (or more narrowband) anti-aliasing filters and severely reduces the usable bandwidth.

Another conventional method uses dithering to eliminate spurious harmonics generated by A/D converters. Dithering is the process of introducing an uncorrelated noise signal, known as dither signal, at the input of an A/D converter. The dither signal smears spurious harmonics over a frequency band. Two well known dithering methods include Subtractive Wideband Dithering and Out-of Band Dithering. Subtractive Wideband Dithering is most effective for generating large dither signals. However, it requires complicated subtracting circuitry for removing the generated dither signal. Dither signals generated by out of band dithering are more easily removed than signals generated by Subtractive Wideband Dithering. For high amplitude signals, however, the advanced analog filter required for generating the dither signals cannot be easily integrated with the circuitry of the receiver.

Dithering effectively removes spurious harmonics, when the amplitude of dither signal is higher than the amplitude of spurious harmonics. Lower order harmonics, such as second and third order harmonics, are created by non-linearities that span a larger part of the A/D converter's input range than higher order harmonics, such as seventh and eight order harmonics. Therefore, higher order harmonics require lower dithering amplitudes, and are sometimes dithered "naturally" by present ambient noise. For removing low order harmonics, however, larger dither amplitudes are required. The larger dither amplitudes decrease the dynamic range of the receiver and complicate the design of bandlimiting filters that create and remove dither signals. For low order harmonics of a strong interfering signal that fall on one or more desired channels, however, dithering may itself degrade the reception quality on a channel by reducing the dynamic range and possibly limiting the amplitude range of the A/D converter, which make reception on the channel virtually impossible. Therefore, there exist a need for a method for removing spurious harmonics produced by non-linearities of A/D converters, without the drawbacks associated with dithering.

SUMMARY

Briefly, the present invention that addresses this need is exemplified in a radio receiver that avoids spurious harmonics of an interfering signal within the bandwidth of a desired channel using an A/D diversity arrangement.

The radio receiver according to one aspect of the present invention converts an original frequency of a modulated received signal, for example, its second IF frequency, into a plurality of digitization frequencies at a pre-A/D conversion stage. At an A/D conversion stage after the pre-A/D conversion stage, the radio receiver digitizes the modulated received signal at the plurality of digitization frequencies, which are preferably offset from each other, for example, arbitrarily or by a predefined frequency interval, in the order of a few channel spacings. At a post-A/D conversion stage, digitized modulated received signals at each one of the digitization frequencies are converted back to a single common frequency, preferably 0 Hz (baseband). At each one of the digitization frequencies, the radio receiver determines a plurality of reception quality values associated with the digitized modulated received signals, for example, corresponding bit error rates (BER) or carrier-to-interference—plus-noise ratios (c/(I+N)). A digital signal processor demodulates the modulated received signal by selecting the digitized output of the modulated received signal that was digitized at a digitization frequency that provides a better reception quality than those digitized at another digitization frequency.

According to some of the more detailed features of the invention, the A/D conversion stage digitizes the modulated received signal at the plurality of digitization frequencies substantially simultaneously. In an exemplary embodiment of this arrangement, the A/D conversion stage includes a plurality of A/D conversion branches. The A/D conversion branches include a plurality of frequency converters that are coupled to a corresponding plurality of A/D converters. The frequency converters convert the original frequency of the modulated received signal into the plurality of digitization frequencies during concurrent sampling intervals. The plurality of A/D converters then simultaneously digitize the modulated received signal at the plurality of digitization frequencies during the concurrent sampling intervals.

In an alternative arrangement, the A/D conversion stage digitizes the modulated received signal at the plurality of digitization frequencies substantially non-simultaneously. In an exemplary embodiment of this arrangement, the A/D conversion stage includes a frequency converter, for example, a hopping synthesizer, that converts the original frequency of the modulated received signal into the plurality of digitization frequencies at a corresponding plurality of non-concurrent sampling intervals. An A/D converter non-simultaneously digitizes the modulated received signal at the plurality of digitization frequencies during corresponding plurality of the non-concurrent sampling intervals.

In another more detailed feature of the invention, a dithering circuit introduces a dithering signal at the A/D conversion stage. Preferably, the A/D diversity arrangement of the invention is used to avoid the lower order spurious harmonics, whereas, dithering is used to remove the higher order spurious harmonics.

The radio receiver according to another aspect of the invention determines a frequency location of an interfering signal and calculates the locations of spurious harmonics resulting from digitizing the interfering signal at the plurality of digitization frequencies. The receiver digitizes the modulated received signal at a digitization frequency that resulting spurious harmonics at that frequency do not fall on a desired channel.

According to yet another aspect of the invention, the radio receiver adaptively converts an original frequency of a modulated received signal to a digitization frequency. An A/D converter digitizes the modulated received signal at the digitization frequency. A frequency controller controls the digitization frequency such that spurious harmonics resulting from digitizing an interfering signal at the digitization frequency do not fall on a desired channel.

Other features and advantages of the present invention will become apparent from the following description of the preferred embodiment, taken in conjunction with the accompanying drawings, which illustrate, by way of example, the principles of the invention.

DESCRIPTION OF THE DRAWING

FIG. 6 is a block diagram of a baseband processor of FIG. 2 according to another aspect of the present invention.

DETAILED DESCRIPTION

Figure 1:
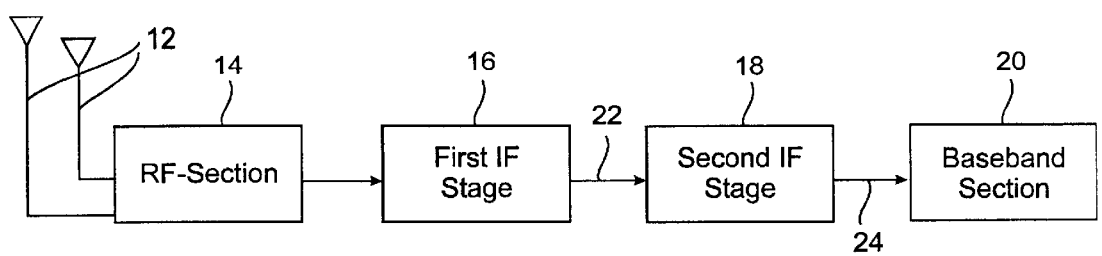
FIG. 1 is a block diagram of a radio receiver that advantageously incorporates an A/D converter according to the present invention.

Referring to FIG. 1, a block diagram of a radio receiver 10 that advantageously incorporates the present invention is shown. The radio receiver 10 includes one or more antennas 12, a RF section 14, a first IF section 16, a second IF section 18, and a baseband processor 20. In a well known manner, the antennas 12 receive desired and interfering signals. The desired received signal comprises a modulating signal that is carried over a carrier signal at a known carrier frequency. In an exemplary embodiment, the radio receiver 10 uses an antenna diversity arrangement for receiving the modulated received signal over a plurality of receiver branches.

Once received, the RF section 14 provides an initial selectivity to the modulated received signal within a relatively wide bandwidth. The first IF section 16 down-converts the received signal with a first local oscillator signal to provide a first IF signal on line 22, which has a pre-defined first IF frequency. The first IF stage 16 provides more selectivity to the modulated received signal, filtering out some interfering signals and passing through the modulated received signal. The first IF signal is applied to the second IF stage 18, which further down-converts the first IF signal to provide a second IF signal on line 24. The second IF signal has an original second IF frequency $f_{IF}$, which is also wide bandwidth. The second IF signal is applied to the baseband processor 20, which digitizes the wide bandwidth second IF signal according to the present invention, to demodulate the modulated received signal.

Figure 2:
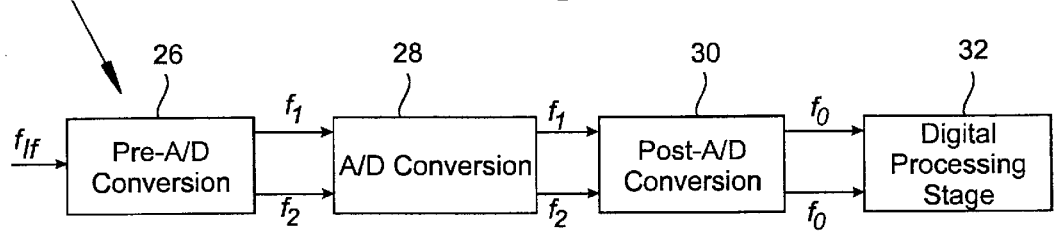
FIG. 2 is a block diagram of a baseband processor section of FIG. 1.
Figure 3:
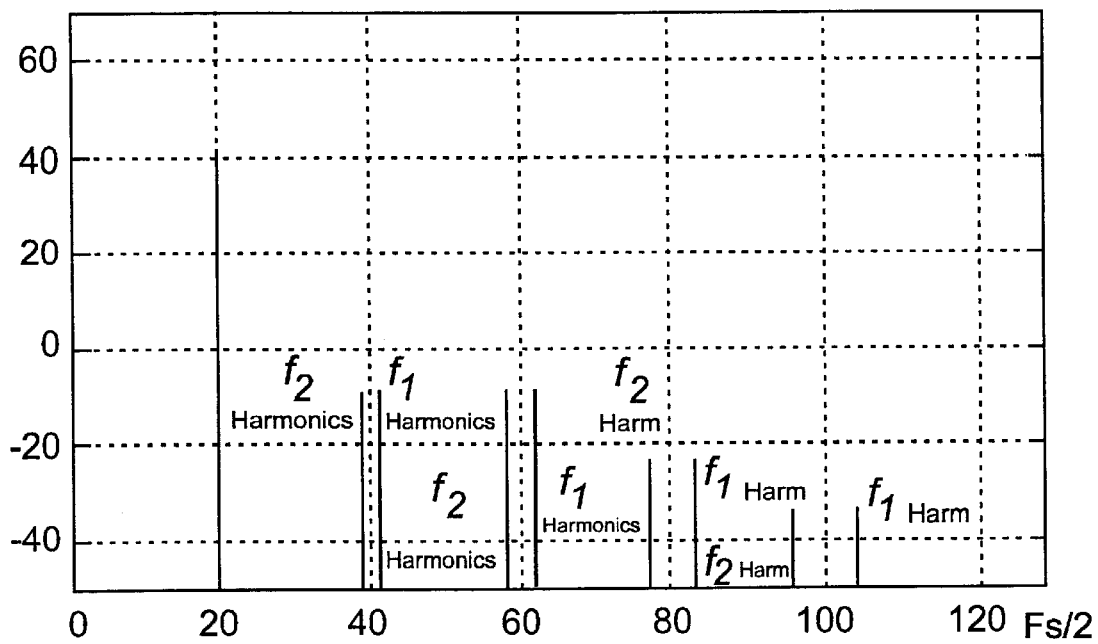
FIG. 3 is a diagram of resulting spurious harmonics at two digitization frequencies.

Referring to FIG. 2, a block diagram of the baseband processor 20 according to one aspect of the present invention is shown to include a pre-A/D conversion stage 26, an A/D conversion stage 28, a post-A/D conversion stage 30, and a digital signal processing stage 32. The present invention uses an A/D diversity arrangement to avoid spurious harmonics of an interfering signal that are generated after the A/D conversion stage 28 over one or more desired channels. At the pre-A/D conversion stage 26, which is before the A/D conversion stage 28, the baseband processor 20 converts the second IF frequency $f_{IF}$ of the second IF signal into a plurality of digitization frequencies that are offset from each other, for example, by a predefined number of channel spacings. At the A/D conversion stage 28, the received signal is digitized at each one of the digitization frequencies at a rate defined by a sampling frequency, $f_s$. In this way, the A/D conversion stage 28 digitizes the modulated received signal during sampling intervals that correspond to the sampling frequency $f_s$. As shown in FIG. 3, after the A/D conversion stage 28, except for frequencies around 0 and $f_s/2$, same spurious harmonics of an interfering signal digitized at two digitization frequencies $f_1$ and $f_2$ are spread over frequency spectrum with a constant offset. In FIG. 3 the spurious harmonics of an interfering signal at two digitization frequencies $f_1$ and $f_2$ are shown by $f_{1harm}$ and $f_{2harm}$, respectively. In the radio receiver 10, the frequencies around 0 and $f_s/2$ are not used as receiver channels due to aliasing. At the post-A/D conversion stage 30, the digitized outputs of the A/D conversion stage 28 at each digitization frequency are reconverted back to a single common frequency $f_0$, preferably 0 Hz. For each digitization frequency, the digital signal processing stage 32 determines a corresponding reception quality measure. Based on corresponding reception quality measures at each one of the digitization frequencies, the base band processor 20 demodulates the modulated received signal at a digitization frequency that provides a better reception quality than at another digitization frequency. As such, the baseband processor 20 constitutes a demodulator that demodulates the modulated signal using a selected one of a plurality of digitization frequencies. Alternatively, the modulated received signal may be demodulated by combining signals at different digitization frequencies, for example, using maximum likelihood combining, based on C/N or C/(N+I) values.

In an exemplary embodiment, the pre-A/D conversion stage 26 converts the original frequency of the second IF signal to a first digitized frequency $f_1$ and a second digitization frequency $f_2$. Preferably, the first digitization frequency $f_1$ and the second digitization frequency $f_2$ are offset from each other by an offset frequency $f_{offset}$, which may have a predefined frequency interval, typically, in the order of a few channel spacings. With a sampling rate defined by the sampling frequency $f_s$, the A/D conversion stage 28 digitizes the modulated received signal at the first digitization frequency $f_1$ and at the second digitization frequency $f_2$. For the first and second digitization of frequencies $f^1$ and $f_2$, the post-A/D conversion stage 30 reconverts the output of the A/D conversion stage back to the common frequency $f_0$. Then, the digital signal processing stage 32 determines reception quality measures associated with digitized outputs that correspond to the first and second digitization frequencies $f_1$ and $f_2$ and demodulates the received signal using the digitized outputs that correspond to a digitization frequency that provides a better reception quality than those corresponding to another digitization frequency. Preferably, the reception quality measure is determined based on one or a combination of received signal, noise, interference strength and/or bit error rate (BER) that is associated with each digitization frequency.

Figure 4:
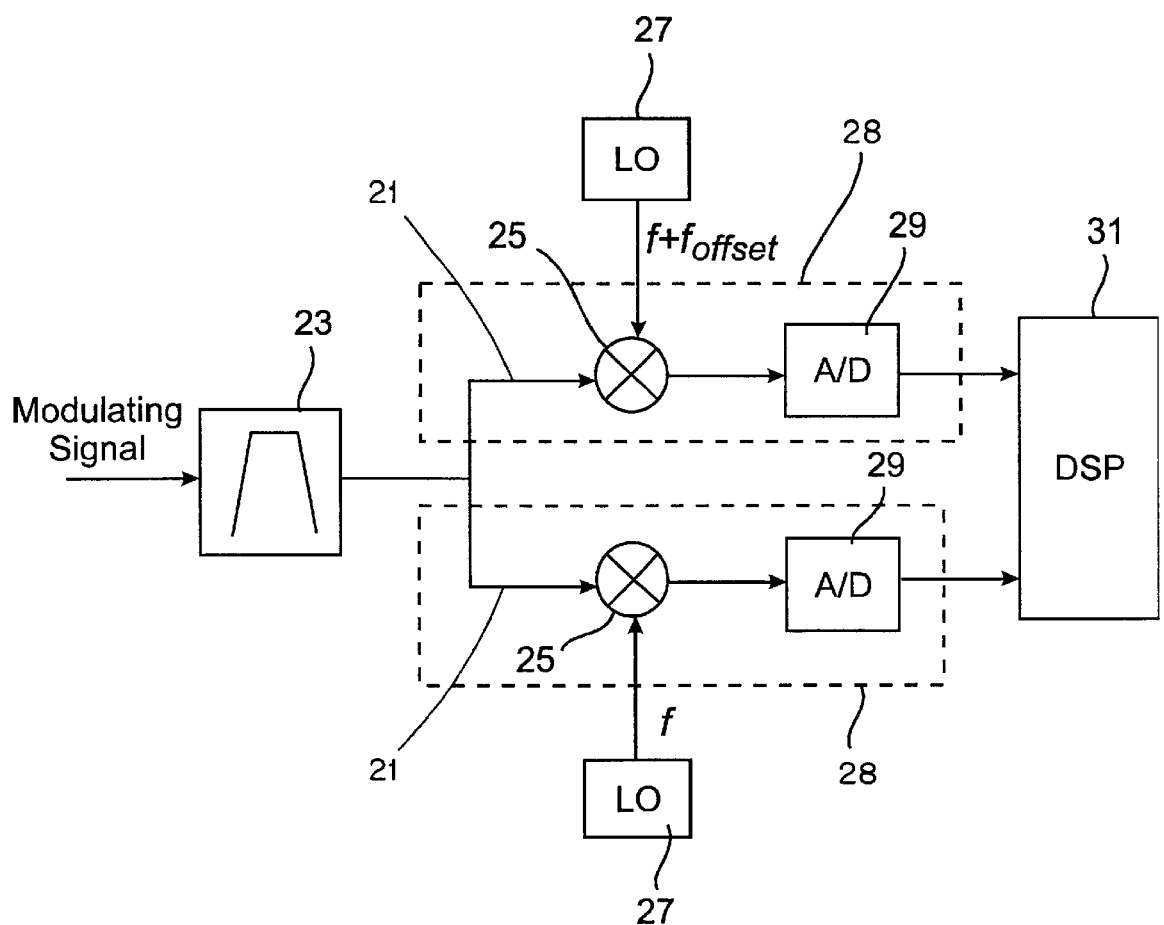
FIG. 4 is a block diagram of an A/D converter according to the present invention.

Referring to FIG. 4, in one aspect of the invention, the modulated received signal is digitized at the plurality of digitization frequencies simultaneously using a plurality of A/D branches 21. The modulated signal is applied to a bandpass filter 23 that simultaneously couples the filtered modulated signal to mixers 25. Mixers 25 mix the filtered modulated signals with local oscillator signals that are generated by local oscillators 27 at frequencies f and $f+f_{offset}$. A/D converters 29 digitize the outputs of the mixers 25 and apply them to a digital signal processor (DSP) 31. As described later in detail, the DSP 31 processes the digitized outputs of the A/D converters 29 according to the present invention.

In another aspect, the modulated received signal is digitized at the plurality of digitization frequencies non-simultaneously using a single A/D converter. Under another arrangement, the present invention locates the strongest interfering signal and computes the location of resulting spurious harmonics at a number of digitization frequencies. Then, the present invention digitizes the modulated received signal at a digitization frequency that avoids the spurious harmonics on a desired channel.

There is a small possibility that some of the spurious harmonics of an interfering signal when digitized at the first and second frequencies $f_1$ and $f_2$ may coincide with each other over a desired channel. Therefore, dithering may be used in connection with the A/D diversity arrangement of the present invention to dither away the higher order spurious harmonics of an interfering signal, for example, harmonics having larger order than the two lowest harmonics. For systems with narrowband channels, the number of receiver channels that can be interfered with by coinciding harmonics of an interfering signal are small compared to the high number of available channels, so it does not matter if dithering leaves a few harmonics intact. Conversely, for wideband systems, the number of channels that may be interfered with are larger compared to the lower number of available channels, so it is preferable to dither away all but the lowest two harmonics. Therefore, dithering is used in combination with the A/D diversity of the present invention to remove higher order spurious harmonics. Under this arrangement, a dither signal is introduced at the input of the A/D conversion stage to dither away higher order spurious harmonics.

Figure 5:
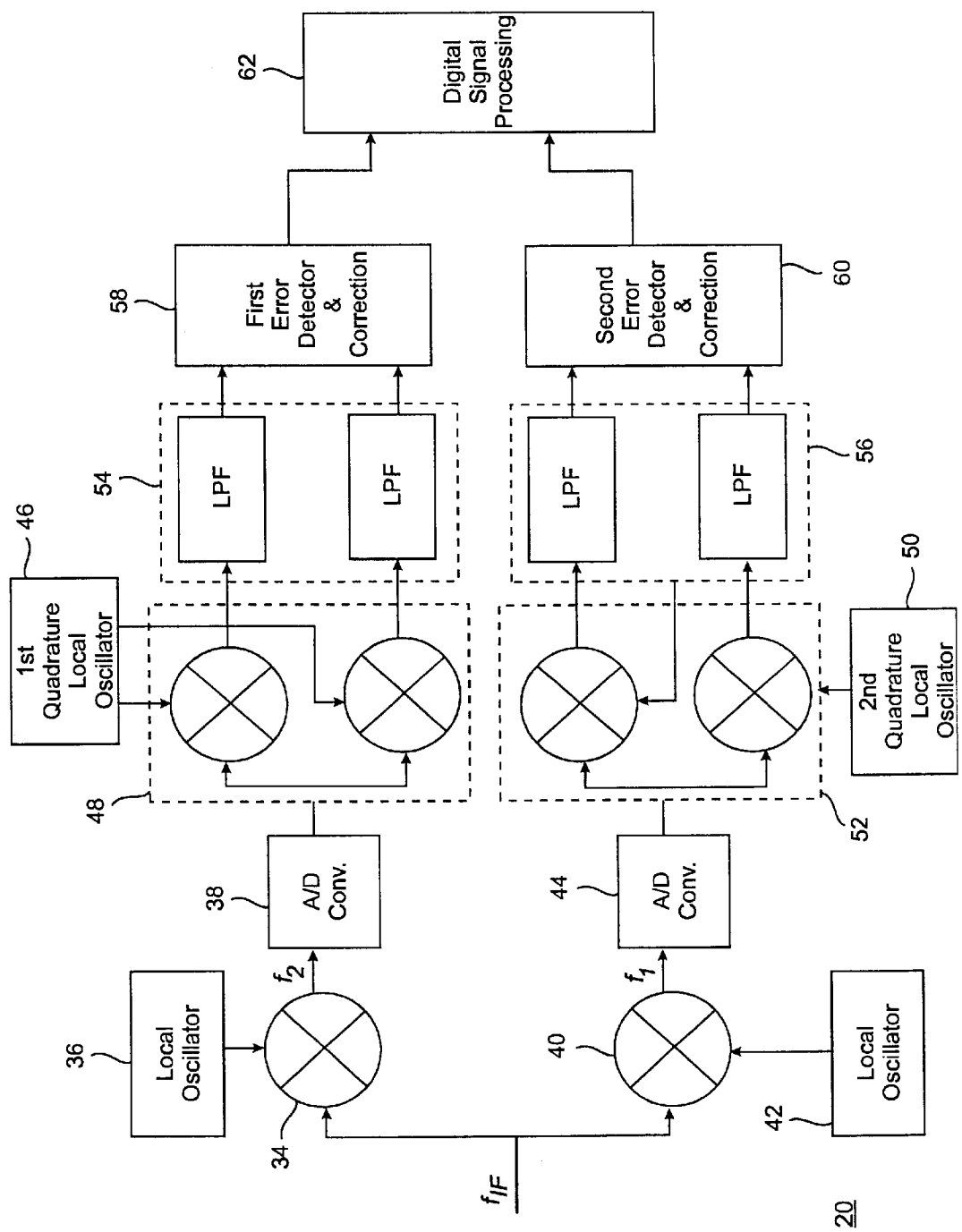
FIG. 5 is a block diagram of a baseband processor of FIG. 2 according to one aspect of the present invention.

Referring to FIG. 5, a block diagram of an exemplary baseband processor 20 according to an embodiment that uses multiple A/D branches is shown. Although any number of A/D branches may be included in the baseband processor 20, the arrangement of FIG. 4 includes two A/D branches that during concurrent sampling intervals simultaneously digitize the received signal at the first digitization frequency $f_1$ and the second digitization frequency $f_2$. More particularly, the baseband processor 20 applies the second IF signal to two separate A/D branches: a first A/D branch and a second A/D branch. The first A/D branch includes a first mixer 34, a first local oscillator 36, and a first A/D converter 38, and the second A/D branch includes a second mixer 40, a second local oscillator 42, and a second A/D converter 44. The first mixer 34 mixes the second IF signal with a signal having first local oscillator frequency provided by the first local oscillator 36. Similarly, the second mixer 40 mixes the second IF signal with a signal having a second local oscillator frequency provided by the second local oscillator 42. The first and second local oscillators frequencies are selected such that the first and second digitization frequencies $f_1$ and $f_2$ have a frequency offset of $f_{offset}$. Accordingly, the first mixer 34 and first local oscillator 36 constitute a first frequency converter that converts the first IF frequency $f_{if}$ to a first digitization frequency $f_1$. Similarly, the second mixer 40 and second local oscillator 42 constitute a second frequency converter that convert the second IF frequency $f_{if}$ to a second digitization frequency $f_2$.

Under this arrangement, one or more frequency synthesizers may be used together with one or more mixers to simultaneously down convert the signals at the first and second local oscillator frequencies. In an exemplary embodiment, a wideband receiver may be used for receiving a wideband multichannel signal for one A/D branch. For the other A/D branch, a one-channel receiver may use a local oscillator signal with an alternative digitization frequency only for the receiver channels that are interfered with. Preferably, the one-channel local oscillator and its associated A/D branch are put in an stand-by mode for saving power during the times that the alternative A/D branch is not necessary.

At a sampling rate defined by the sampling frequency $f_s$, the first A/D converter 38 digitizes the output of the first mixer 34, and the second A/D converter 44 digitizes the output of the second mixer 40. The baseband processor 20 processes the outputs of the first and second A/D converters 38 and 44 in digital domain to demodulate the received RF signal. Under this arrangement, the output of the first A/D converter 38 is applied to a first quadrature frequency converter, which includes a first quadrature local oscillator 46 and a first quadrature mixer 48. The first quadrature frequency converter converts the digitized modulated received signal at the output of the first A/D converter 38 to the common frequency $f_0$. Similarly, the output of the second A/D converter 44 is applied to a second quadrature frequency converter, which includes a second quadrature local oscillator 50 and a second quadrature mixer 52. The second quadrature frequency converter converts the digitized modulated signal at the output of the second A/D converter 44 to the common frequency $f_0$ as well. First and second low pass digital filters 54 and 56 remove spurious signals at outputs of the first and second quadrature frequency converters, respectively.

First and second error correcting and detecting blocks 58 and 60 process the digitized outputs of each A/D branch to determine an associated measure of reception quality, for example, BER or C/(I+N) associated with each A/D branch. Digital signal processing block 62 processes the digitized outputs of the first and second A/D converter branches and selects the output of an A/D branch that provides a better reception quality than that of the other A/D branches $f_0$. Both selection diversity and maximum likelihood combination can be used. Maximum likelihood combination uses a combination of branches, mainly the best branch, based on C/(I+N). Under this technique, the signal of a branch is added in phase with all other signals, multiplied by a weighing factor, usually the signal strength or C/(I+N). Alternatively, interference rejection combining (IRC) technique, which is an adaptive antenna technique, may also be used. Under the IRC technique, interference is nulled out by combining it in an "antiphase" manner.

It would be appreciated that under the embodiment of FIG. 5, the first and second local oscillators and mixers constitute the pre-A/D conversion stage 26, the first and second A/D converters constitute the A/D conversion stage 28, the first and second quadrature local oscillators and mixers constitute the post-A/D conversion stage 30, and the digital signal processing block 62 constitutes the digital processing stage 32.

Referring to FIG. 6, a block diagram of the baseband processor 20 according to another aspect of the invention that uses a single A/D conversion branch is shown. Under this embodiment, the pre-A/D conversion stage mixes the second IF frequency of second IF signal $f_{if}$ through a mixer 64 with signals having first and second local oscillator frequencies. Under this arrangement, a local oscillator, for example, a hopping synthesizer, is controlled to generate the first and second local oscillator frequencies non-simultaneously. In a multiplexed manner, the hopping synthesizer 66 provides the first local oscillator frequency during a first sampling interval and then provides the second local oscillatory frequency during a second sampling interval, which occurs non-concurrent to the first sampling interval. In this way, the mixer 64 produces the first digitization frequency $f_1$ and the second digitization frequency $f_2$ at separate sampling intervals. The A/D conversion stage includes a single A/D converter 68 that non-concurrently digitizes the received signal at the first and second digitization frequencies during the first and second sampling intervals. The post-A/D conversion stage includes a quadrature frequency converter, which has a quadrature local oscillator 70 and a quadrature mixer 72, that converts the digitized output of the A/D converter at the first digitization frequency $f_1$ and second digitization frequency $f_2$ to the common frequency $f_0$. Of course, the hopping synthesizer 66 and the quadrature local oscillator 70 are controlled to synchronously perform their respective frequency conversion and reconversion functions. A digital filter block 74 digitally removes undesired outputs of the quadrature mixer block 72. A digital signal processing block 76 determines the reception quality measures at the first and second digitization frequencies $f_1$ and $f_2$. Once determined, the digital signal processing block 76 demodulates the received signal using a digitization frequency that provides a better reception quality.

Under another aspect of the invention, the synthesizer 66 controls the frequency of the local oscillator signal to move the spurious harmonics away from a desired channel. As such the synthesis 66 acts as a frequency controller that moves the spurious harmonics away from a desired channel. For this embodiment, the synthesizer 66 preferably comprises a direct digital synthesizer (DDS).

It would be appreciated that by increasing the number of A/D branches the chance of avoiding spurious harmonics of an interfering signal increases, thereby reducing the possibility of having coinciding spurious harmonics on a desired channel. Furthermore, the present invention can be used in a radio receiver that uses an antenna diversity arrangement, where a plurality of receiver branches provide the modulated received signal from multiple propagation paths. Under this arrangement, each receiver branch may have dedicated or shared A/D branches.

Table 1 below shows a comparison of usable channel bandwidth, as a percentage of Nyquist band, between the present invention and the conventional "harmonic avoidance" method. In the second column, Table 1 shows usable bandwidth depending gon the order of the spurious harmonics of the first column. The usable bandwidth—a percentage of Nyquist band—is a function of the order of the harmonics. In the last column of Table 1, 'Hits' denotes the number of possible interferer frequencies for which two different harmonics can coincide inside complete bandwidth.

TABLE 1

| 1<br>Harmonics | 2<br>Conv.<br>Harmonics<br>Avoidance | 3<br>Present<br>Invention | 4<br>'Hits' In<br>100% of BW |
| --- | --- | --- | --- |
| 2 | 33% | ~100% | 0 |
| 3 | 33% | ~100% | 0 |
| 4 | 30% | ~100% | 0 |
| 2 + 3 | 25% | ~80% | 2 |
| 2 + 3 + 4 | 20% | ~57% | 7 |
| 2 + 3 + 4 + 5 | 17% | ~44% | 13 |

From the foregoing description it would be appreciated that the present invention effectively avoids spurious harmonics of interfering signals over receiver channels. Specially the present invention is effective in avoiding low order harmonics, which are created by non-linearities that span a substantial part of the A/D converter's input range and thus, cannot be removed easily by dithering. As explained above, the present invention may be combined with dithering, to remove as many harmonics as possible. In this way, the combination of dithering with diversity arrangement of invention significantly reduces the undesired effects of non-linearities in A/D converters. Accordingly, the present invention avoids large scale dithering resulting in lower cost dithering circuitry. With multiple A/D conversion branches, multiple less expensive A/D converters may be used instead of a single expensive A/D converter.

Although the invention has been described in detail with reference only to a preferred embodiment, those skilled in the art will appreciate that various modifications can be made without departing from the invention. Accordingly, the invention is defined only by the following claims which are intended to embrace all equivalents thereof.

What is claimed is:

1. A radio receiver, comprising:
   an A/D conversion stage that converts a modulated received signal into a plurality of offset frequency signals and digitizes the plurality of offset frequency signals to provide a corresponding plurality of digitized outputs;
   a digital signal processor that determines a plurality of reception quality measures associated with the plurality of the digitized outputs; and
   a demodulator that demodulates the modulated received signal, wherein the demodulator demodulates the modulated received signal using the digitized outputs corresponding to an offset frequency signal that provides a better reception quality than that of another offset frequency signal.

2. The receiver of claim 1, wherein the A/D conversion stage digitizes the plurality of offset frequency signals substantially simultaneously.

3. The receiver of claim 2, wherein the A/D conversion stage includes a plurality of A/D branches comprising a plurality of frequency converters coupled to a corresponding plurality of A/D converters, wherein the frequency converters convert an original frequency of the modulated received signal into the plurality of offset frequencies during concurrent sampling intervals, and wherein the plurality of A/D converters simultaneously digitize the converted modulated received signal during the concurrent sampling interval.

4. The receiver of claim 2, wherein the plurality of A/D converters digitize the plurality of offset frequency signals at a rate defined by a sampling frequency $f_s$.

5. The receiver of claim 1, wherein the A/D conversion stage digitizes the plurality of offset frequency signals substantially non-simultaneously.

6. The receiver of claim 5, wherein the A/D conversion stage includes a frequency converter circuit that converts an original frequency of the modulated received signal into the plurality of offset frequency signals at a corresponding plurality of non-current sampling intervals, and a A/D converter that digitizes the offset frequency signals during the non-concurrent sampling intervals.

7. The receiver of claim 6, wherein the frequency converter circuit comprises a hopping synthesizer.

8. The receiver of claim 1, wherein the plurality of offset frequencies are offset from each other by a predefined frequency interval.

9. The receiver of claim 1, further including a dithering circuit for introducing a dithering signal at the A/D conversion stage.

10. A radio receiver, comprising:
 a pre-A/D conversion stage that converts an original frequency of a modulated received signal into a plurality of digitization frequencies;
 an A/D conversion stage that digitizes the received signal at each one of the plurality of digitization frequencies to provide a corresponding plurality of digitized outputs;
 a post-A/D conversion stage that converts each one of the plurality of digitized outputs at the digitization frequencies to a common frequency; and
 a demodulator that demodulates the received signal using a digitized output.

11. The radio receiver of claim 10, wherein the digitized output for demodulating the received signal is a selected one of the plurality of digitized outputs.

12. The radio receiver of claim 10, wherein the digitized output for demodulating the modulated received signal is produced by combining at least two digitized outputs among said plurality of digitized outputs.

13. The radio receiver of claim 10 further including a digital signal processor that demodulates the received signal by selecting a digitized output corresponding to a digitization frequency that provides a better reception quality than another digitization frequency.

14. The receiver of claim 10, wherein the A/D conversion stage digitizes the modulated received signal at the plurality of digitization frequencies substantially simultaneously.

15. The receiver of claim 14, wherein the pre-A/D conversion stage includes a plurality of frequency converters and the A/D conversion stage includes a plurality of A/D converters correspondingly coupled to the plurality of frequency converters, wherein the frequency converters convert an original frequency of the modulated received signal into the plurality of digitization frequencies during concurrent sampling intervals, and wherein the plurality of A/D converters simultaneously digitize the modulated received signal during the concurrent sampling intervals.

16. The receiver of claim 15, wherein the post-A/D conversation stage includes a plurality of quadrature frequency converters that are correspondingly coupled to the outputs of the plurality of A/D converters.

17. The receiver of claim 15, wherein the plurality of A/D converters digitize the modulated received signal at a rate defined by a sampling frequency $f_s$.

18. The receiver of claim 10, wherein the A/D conversion stage digitizes the modulated received signal at the plurality of digitization frequencies substantially non-simultaneously.

19. The receiver of claim 18, wherein the pre-A/D conversion stage includes a frequency converter that converts an original frequency of the modulated received signal into the plurality of digitization frequencies at a corresponding plurality of non-concurrent sampling intervals, and the A/D conversion stage includes a A/D converter that non-simultaneously digitizes the modulated received signal during the non-concurrent sampling time intervals.

20. The receiver of claim 19, wherein the post-A/D conversation stage includes a quadrature frequency converter coupled to the output of the A/D converter.

21. The receiver of claim 19, wherein the frequency converter comprises a hopping synthesizer.

22. The receiver of claim 10, wherein the plurality of digitization frequencies are offset from each other by a predefined frequency interval.

23. The receiver of claim 10 further including a dithering circuit for introducing a dithering signal at the A/D conversion stage.

24. A method for demodulating a modulated signal, comprising:
 converting an original frequency of a modulated received signal into a plurality of offset frequency signals;
 digitizing the plurality of offset frequency signals to provide a corresponding plurality of digitized outputs;
 converting each one of the plurality of digitized outputs to a common frequency; and
 demodulating the received signal using a digitized output.

25. The method of claim 24, wherein the digitized output for demodulating the received signal is a selected one of the plurality of digitized outputs.

26. The method of claim 24, wherein the digitized output for demodulating the received signal is produced by combining at least two digitized outputs among said plurality of digitized outputs.

27. The method of claim 24 further including the step of:
 determining a plurality of reception quality measures associated with each one of the digitized modulated received signals corresponding to the plurality of offset frequency signals.

28. The method of claim 24, wherein the plurality of offset frequency signals are digitized substantially simultaneously.

29. The method of claim 24, wherein the plurality of offset frequency signals are digitized substantially non-simultaneously at a corresponding plurality of non-current sampling intervals.

30. The method of claim 29, wherein the plurality of offset frequencies are offset from each other by a predefined number of channel spacings.

31. The method of claim 29, further including the step of introducing a dithering signal while digitizing the modulated received signal.

32. The receiver of claim 24, wherein the plurality of A/D converters digitize the plurality of offset frequency signals at a rate defined by a sampling frequency $f_s$.

* * * * *